United States Patent [19]
Morishita et al.

[11] Patent Number: 6,046,476
[45] Date of Patent: Apr. 4, 2000

[54] SOI INPUT PROTECTION CIRCUIT

[75] Inventors: Fukashi Morishita; Kazutami Arimoto, both of Itami, Japan

[73] Assignee: Mitsubishi Denki Kabushiki Kaisha, Tokyo, Japan

[21] Appl. No.: 08/559,264

[22] Filed: Nov. 15, 1995

[30] Foreign Application Priority Data

Jul. 6, 1995 [JP] Japan ..................... 7-170832

[51] Int. Cl.⁷ ................................. H01L 27/02
[52] U.S. Cl. ................ 257/347; 257/355; 257/653
[58] Field of Search .................... 257/347, 653, 257/355, 352, 497

[56] References Cited

U.S. PATENT DOCUMENTS 5,113,236  5/1992  Arnold et al. ................ 257/347
5,382,818  1/1995  Pein ............................... 257/344

FOREIGN PATENT DOCUMENTS 7-7820  1/1995  Japan .

OTHER PUBLICATIONS

ULSI DRAM Technology, Sep. 25, 1992, p. 67.

*Primary Examiner*—Sara W. Crane
*Assistant Examiner*—David B. Hardy
*Attorney, Agent, or Firm*—Lowe, Price, LeBlanc & Becker

[57] ABSTRACT

In an input protection circuit having an SOI structure for protecting a MOSFET against breaking caused by a high voltage such as static electricity, a trench is provided in an SOI substrate to vertically pass through a silicon layer and a buried oxide film and reach the interior of a P-type silicon substrate. An $n^+$ polysilicon layer is buried in the trench, to be connected with the silicon substrate by a P-N junction. A wire is connected to the $n^+$ polysilicon layer. An end of the wire is connected to an input pad, and another end thereof is connected to an internal circuit. An input voltage is limited by an avalanche breakdown at the P-N junction in the interface between the $n^+$ polysilicon layer and the P-type silicon substrate.

1 Claim, 9 Drawing Sheets 6,046,476

1

SOI INPUT PROTECTION CIRCUIT

BACKGROUND OF THE INVENTION

1. Field of the Invention

The present invention generally relates to an input protection circuit which is applied to a semiconductor integrated circuit device having an SOI (silicon on insulator) structure, and more particularly, it relates to an SOI input protection circuit which is provided between an input pad and an internal circuit for protecting a MOSFET against breaking caused by a high voltage such as static electricity.

2. Description of the Background Art

FIG. 9 is a sectional view showing a conventional thin-film SOI-MOSFET. This thin-film SOI-MOSFET comprises a $p^-$-type silicon substrate 1. A buried oxide film (BOX) 2 is formed on the silicon substrate 1. A silicon layer 20 is provided on the buried oxide film 2. A gate electrode 23 is provided on the silicon layer 20. A source region 21 and a drain region 22 are formed in the surface of the silicon layer 20, on both sides of the gate electrode 23.

FIG. 10 is a sectional view showing another conventional MOSFET having a bulk structure, which is precedent to the above thin-film SOI-MOSFET. Referring to FIG. 10, the conventional bulk-structure MOSFET comprises a $p^-$-type silicon substrate 1. A gate electrode 23 is provided on the silicon substrate 1. A source region 21 and a drain region 22 are provided in the surface of the silicon substrate 1, on both sides of the gate electrode 23.

In the bulk-structure MOSFET shown in FIG. 10, a capacitor 24 is formed by contact surfaces of the source region 21 and the silicon substrate 1, while another capacitor 25 is formed by contact surfaces of the drain region 22 and the silicon substrate 1. In order to drive the bulk-structure MOSFET, therefore, it is necessary to first charge the capacitors 24 and 25, and hence a large quantity of power and a long time are required.

In order to solve this problem, the conventional thin-film SOI-MOSFET shown in FIG. 9 has been proposed. In the thin-film SOI-MOSFET, a capacitor 26 is formed between the source region 21 and the silicon substrate 1, while another capacitor 27 is formed between the drain region 22 and the silicon substrate 1. However, power is hardly necessary for charging these capacitors 26 and 27, since the same have small capacitances. Therefore, the thin-film SOI-MOSFET can be driven at a higher speed with lower power consumption as compared with the conventional bulk-structure SOI-MOSFET. In the thin-film SOI-MOSFET, further, radiation resistance is improved as compared with the conventional bulk-structure SOI-MOSFET, and high densification is possible. Due to these advantages, the thin-film SOI-MOSFET is watched with interest as a unit which can increase the speed of a semiconductor circuit device and implement a circuit device of an ultralow voltage and low power consumption which is applicable to a portable terminal or the like, and can be employed in a DRAM following that of 1 gigabit.

However, a problem which is specific to an SOI element has thereafter arisen also in such a semiconductor integrated device.

The present invention relates to solution of problems which are caused with respect to an input protection circuit, in particular.

FIG. 11 is a circuit diagram showing a conventional input protection circuit. A semiconductor integrated circuit device comprises an input pad and an internal circuit. Resistances

2

1 and 2 are provided between the input pad and the internal circuit. A protective transistor is provided between the resistances 1 and 2. The operation is as follows: When a nonstandardized voltage is applied to the input pad, the peak voltage is depressed by the resistance 1. Then, the current is pulled to a power source Vcc or GND by a punch through via the protective transistor. Further, the peak voltage is depressed by the resistance element 2, and the current is propagated to the internal circuit. Thus, the internal circuit elements can be prevented from breaking.

FIG. 12 is a plan view showing a protective transistor in an input protection circuit which is employed in a bulk structure. FIG. 13 is a sectional view taken along the line A—A in FIG. 12.

Referring to FIGS. 12 and 13, the protective transistor comprises a P-type silicon substrate 1. A LOCOS oxide film 7 is provided in the major surface of the P-type silicon substrate 1. An $n^+$ diffusion layer 6 and another $n^+$ diffusion layer 16 are provided to be isolated from each other by the LOCOS oxide film 7. The $n^+$ diffusion layers 6 and 16 are a source and a drain of the protective transistor. An interlayer insulating film 5 is provided on the silicon substrate 1. The interlayer insulating film 5 is provided therein with contact holes 4a and 14a for exposing the surfaces of the $n^+$ diffusion layers 6 and 16 respectively. The $n^+$ diffusion layer 6 is provided with a first metal wire 4 having an end which is connected to an input pad, and another end which is connected to an internal circuit through a resistance 2. A second metal wire 14 is connected to the $n^+$ diffusion layer 16. When a high voltage of 1000 to 10000 V by static electricity or the like is applied to the input pad, the input voltage is limited to about 3 V by a punch through across the source and the drain (across the $n^+$ diffusion layers 6 and 16) of the protective transistor.

FIG. 14 is a plan view showing an input protection circuit which is formed by a diode by a P-N junction. FIG. 15 is a sectional view taken along the line A—A in FIG. 14.

Referring to FIGS. 14 and 15, the input protection circuit which is formed by only a diode by a P-N junction comprises a P-type silicon substrate 1. An $n^+$ diffusion layer 6 is provided in the major surface of the silicon substrate 1. The $n^+$ diffusion layer 6 is isolated from other element regions by a LOCOS oxide film 7 which is provided in the major surface of the silicon substrate 1. An interlayer insulating film 5 is provided on the silicon substrate 1. The interlayer insulating film 5 is provided therein with a contact hole 4a for partially exposing the surface of the $n^+$ layer 6. The $n^+$ layer 6 is connected with a metal wire 4 having an end which is connected to an input pad and another end which is connected to an internal circuit. When a high voltage by static electricity or the like is applied to the input pad, the input voltage is limited by an avalanche breakdown at the P-N junction of the drain ($n^+$ diffusion layer 6).

In relation to such an input protection circuit, a problem which is specific to the aforementioned SOI element is now described.

FIG. 16 is a sectional view showing an SOI substrate. This SOI substrate consists of a silicon substrate 1, a buried oxide film 2, and a silicon layer 20. The buried oxide film 2 is formed by implanting oxygen into the silicon substrate 1. The silicon layer 20 and the buried oxide film 2 have thicknesses of 1000 Å and 4000 Å respectively.

In the input protection circuit, it is necessary to ensure a sufficient junction area, in order to avoid electric field concentration. When the aforementioned protection circuit is applied to an SOI substrate as such, however, no protection circuit can be structured. For example, the LOCOS oxide film 7, which is 6000 Å in thickness, cannot be formed in the silicon layer 20. Due to the presence of the buried oxide film 2, further, no P-N junction can be formed along the thickness of the substrate.

SUMMARY OF THE INVENTION

Accordingly, an object of the present invention is to provide an input protection circuit having a sufficiently large P-N junction area, which is resistant against a high voltage such as static electricity, in a semiconductor integrated circuit device having an SOI structure.

Another object of the present invention is to provide an SOI input protection circuit which can limit an input voltage by an avalanche breakdown at a P-N junction.

Still another object of the present invention is to provide an SOI input protection circuit which is improved to be capable of limiting an input voltage by a punch through across a source and a drain.

An SOI input protection circuit according to a first aspect of the present invention is provided between an input pad and an internal circuit. This SOI input protection circuit comprises an SOI substrate consisting of a first conductivity type silicon substrate, a buried oxide film which is formed on the silicon substrate, and a silicon layer which is formed on the buried oxide film. A trench vertically passes through the silicon layer and the buried oxide film. The trench reaches the interior of the silicon substrate. A second conductivity type conductive layer is buried in the trench, to be connected with the silicon substrate by a P-N junction. A metal wire is connected to the conductive layer. An end of this metal wire is connected to the input pad, while another end thereof is connected to the internal circuit.

An SOI input protection circuit, which is provided between an input pad and an internal circuit, according to a second aspect of the present invention is adapted to limit an input voltage by an avalanche breakdown at a P-N junction. This SOI input protection circuit comprises an SOI substrate consisting of a silicon substrate, a buried oxide film which is formed on the silicon substrate, and a first conductivity type silicon layer which is formed on the buried oxide film. A second conductivity type conductive layer is provided on the silicon layer, to be connected with the silicon layer by a P-N junction. A first metal wire is connected to the conductive layer. An end of the first metal wire is connected to the input pad, while another end thereof is connected to the internal circuit. This SOI input protection circuit further comprises a second wire which is provided in separation from the conductive layer and provided on the silicon layer to be connected with the silicon layer, for extracting charges which are injected into the silicon layer by an avalanche breakdown.

An SOI input protection circuit according to a third aspect of the present invention is provided between an input pad and an internal circuit. This SOI input protection circuit comprises a first conductivity type silicon substrate. A buried oxide film having an opening partially exposing the surface of the silicon substrate is provided on the silicon substrate. A first conductivity type silicon layer is provided in the opening. A second conductivity type conductive layer is provided on the silicon layer, to be connected with the silicon layer by a P-N junction. A wire is connected to the conductive layer. An end of this wire is connected to the input pad, while another end thereof is connected to the internal circuit. In this SOI input protection circuit, an input voltage is limited by an avalanche breakdown at the P-N junction.

An SOI input protection circuit according to a fourth aspect of the present invention is provided between an input pad and an internal circuit. This SOI input protection circuit comprises an SOI substrate consisting of a first conductivity type silicon substrate, a buried oxide film which is formed on the silicon substrate, and a silicon layer which is formed on the buried oxide film. A first trench vertically passes through the silicon layer and the buried oxide film, and reaches the interior of the silicon substrate. This SOI input protection circuit further comprises a second trench which is formed in separation from the first trench and vertically passes through the silicon layer and the buried oxide film to reach the interior of the silicon substrate. A second conductivity type first conductive layer is buried in the first trench, to be electrically connected to the silicon substrate. A second conductivity type second conductive layer is buried in the second trench, to be electrically connected to the silicon substrate. A LOCOS oxide film is provided in the silicon layer, to electrically isolate the first and second conductive layers from each other. A first wire is connected to the first conductive layer. An end of the first wire is connected to the input pad, while another end thereof is connected to the internal circuit. A second wire is connected to the second conductive layer. In this SOI input protection circuit, an input voltage is limited by a punch through across the first and second conductive layers.

An SOI input protection circuit according to a fifth aspect of the present invention is provided between an input pad and an internal circuit. This SOI input protection circuit comprises an SOI substrate consisting of a silicon substrate, a buried oxide film which is formed on the silicon substrate, and a first conductivity type silicon layer which is formed on the buried oxide film. A second conductivity type first conductive layer is provided on the silicon layer, to be connected with the silicon layer. This SOI input protection circuit further comprises a second conductivity type second conductive layer which is formed in separation from the first conductive layer and provided on the silicon layer to be connected with the silicon layer. A first wire is connected to the first conductive layer. An end of the first wire is connected to the input wire, while another end thereof is connected to the internal circuit. A second wire is connected to the second conductive layer. An input voltage is limited by a punch through across the first and second conductive layers.

An SOI input protection circuit according to a sixth aspect of the present invention is provided between an input pad and an internal circuit. This SOI input protection circuit comprises a first conductivity type silicon substrate. A buried oxide film having an opening partially exposing the surface of the silicon substrate is provided on the silicon substrate. A first conductivity type silicon layer is provided in this opening, to be in contact with the silicon substrate. This SOI input protection circuit further comprises second conductivity type first and second conductive layers which are provided on the silicon layer to be connected with the silicon layer and separated from each other. A LOCOS oxide film is provided on the silicon layer, to electrically isolate the first and second conductive layers from each other. A first wire is connected to the first conductive layer. An end of the first wire is connected to the input pad, while another end thereof is connected to the internal circuit. A second wire is connected to the second conductive layer. In this SOI input protection circuit, an input voltage is limited by a punch through across the first and second conductive layers.

Each of the SOI input protection circuits according to the first and fourth aspects of the present invention comprises the trench vertically passing through the silicon layer and the buried oxide film to reach the interior of the silicon substrate. The second conductivity type conductive layer is buried in this trench to be connected with the silicon substrate by a P-N junction. Therefore, a sufficiently large P-N junction area can be attained.

In each of the SOI input protection circuits according to the second and fifth aspects of the present invention, the second conductivity type conductive layer is provided on the silicon layer to be connected with the silicon layer by a P-N junction, whereby a sufficiently large P-N junction area can be attained.

In each of the SOI input protection circuits according to the third and sixth aspects of the present invention, the buried oxide film is partially opened, whereby the silicon layer forming the uppermost layer of the SOI structure and the silicon substrate are electrically connected with each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

Embodiment 1

Figure 1:
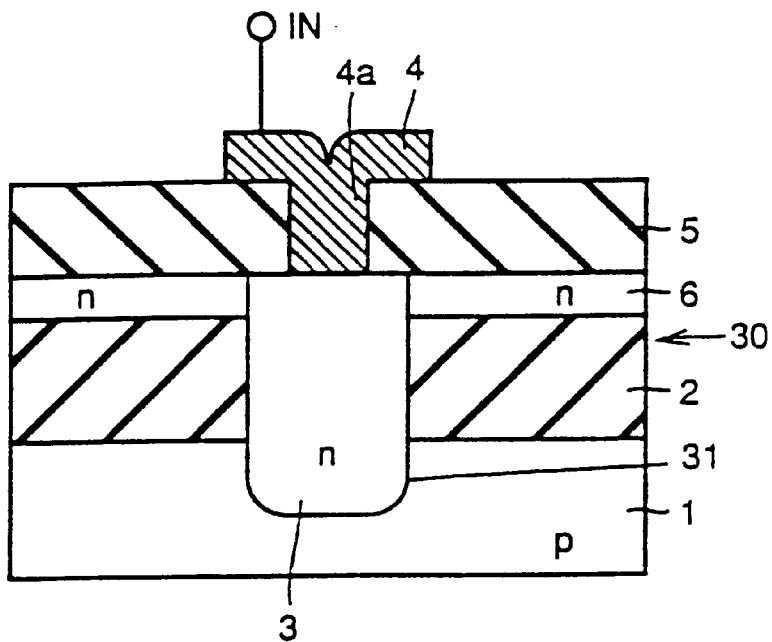
FIG. 1 is a sectional view showing an SOI input protection circuit according to an embodiment 1 of the present invention.
Figure 12:
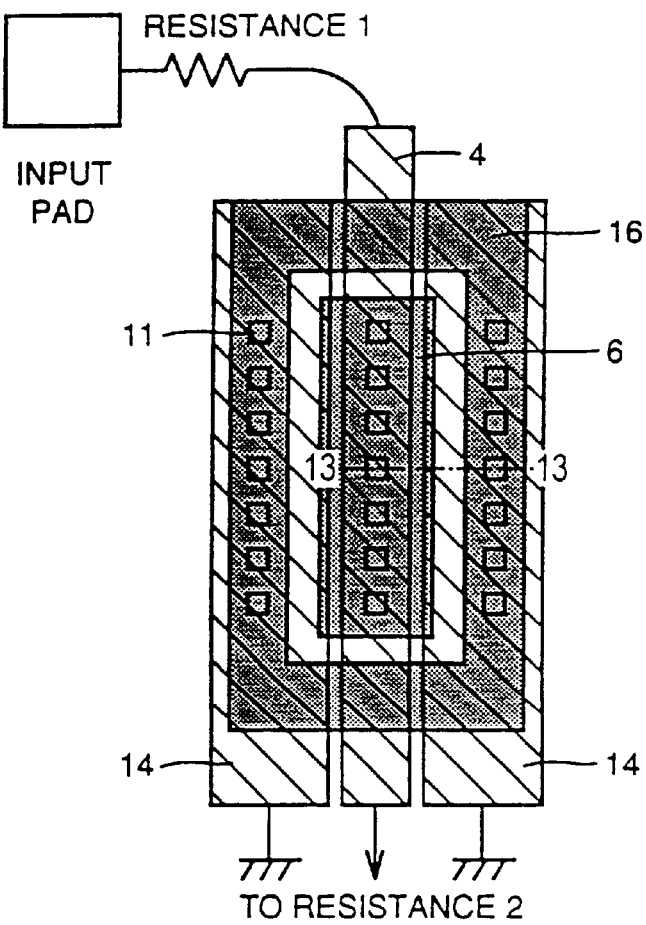
FIG. 12 is a plan view showing an input protection transistor which is employed for a conventional semiconductor circuit device having a bulk structure.
Figure 13:
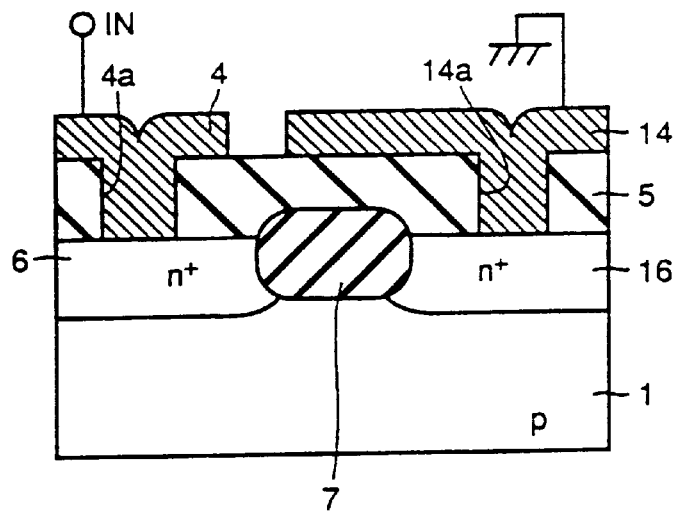
FIG. 13 is a sectional view taken along the line A—A in FIG. 12.
Figure 14:
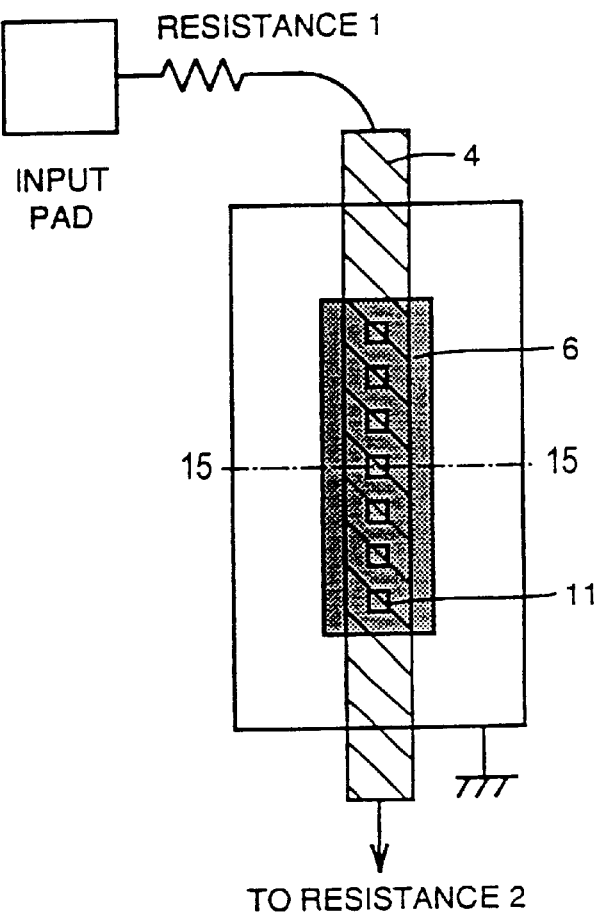
FIG. 14 is a plan view showing an input protection diode which is employed for a conventional semiconductor integrated circuit device having a bulk structure.
Figure 15:
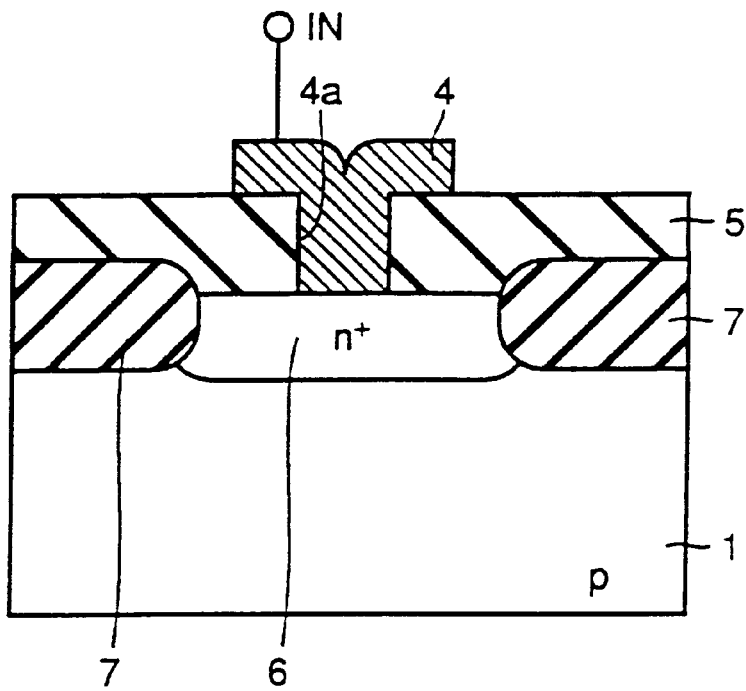
FIG. 15 is a sectional view taken along the line A—A in FIG. 14.
Figure 16:
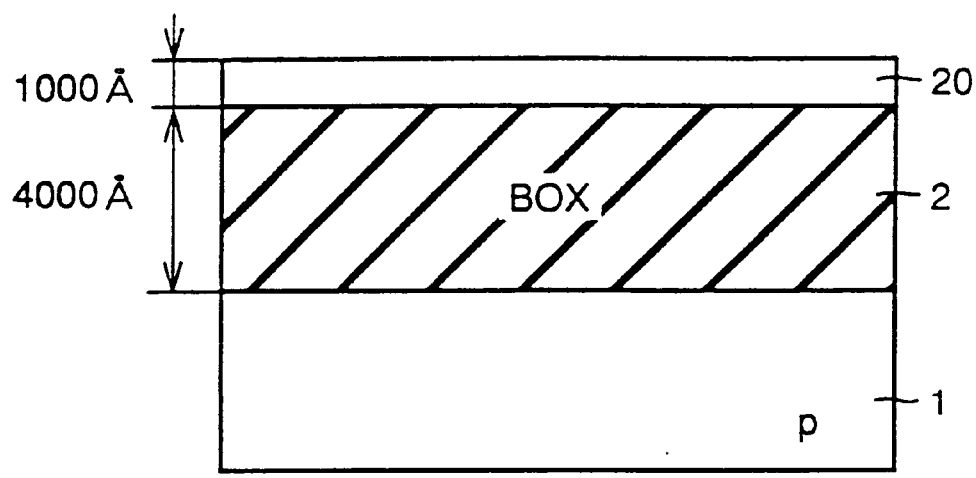
FIG. 16 is a sectional view showing a conventional SOI substrate.

FIG. 1 is a sectional view showing an SOI input protection circuit according to an embodiment 1 of the present invention. In a plan view, the shape of the SOI input protection circuit according to the embodiment 1 is identical to that shown in FIG. 12.

Referring to FIG. 1, the SOI input protection circuit comprises an SOI substrate 30. The SOI substrate 30 consists of a P-type silicon substrate 1, a buried oxide film 2 which is formed on the silicon substrate 1, and a silicon layer 6 which is formed on the buried oxide film 2. An N-type impurity is implanted into the silicon layer 6. The SOI substrate 30 is prepared by implanting oxygen ions into a silicon wafer, thereby forming the buried oxide film 2. The SOI substrate 30 is provided therein with a trench 31 vertically passing through the silicon layer 6 and the buried oxide film 30 to reach the interior of the silicon substrate 1. An $n^+$ polysilicon layer 3 is buried in the trench 31, to be connected with the silicon substrate 1 by a P-N junction. An interlayer insulating film 5 is provided on the SOI substrate 30. A contact hole 4a is provided in this interlayer insulating film 5, in order to partially expose the surface of the $n^+$ polysilicon layer 3. A metal wire 4 is connected to the $n^+$ polysilicon layer 3 through the contact hole 4a. An end of the metal wire 4 is connected to an input pad, while another end thereof is connected to an internal circuit.

Due to employment of the structure shown in FIG. 1, a sufficient P-N junction area can be ensured in a deep portion of the SOI substrate 30, thereby reducing power concentration to the P-N junction plane. When a high voltage is applied, the P-type silicon substrate 1 is fixed at the GND potential, so that charges are propagated to the $n^+$ polysilicon layer 3 through the metal wire 4. The input voltage is limited by an avalanche breakdown at the P-N junction plane between the $n^+$ polysilicon layer 3 and the P-type silicon substrate 1.

Embodiment 2

Figure 2:
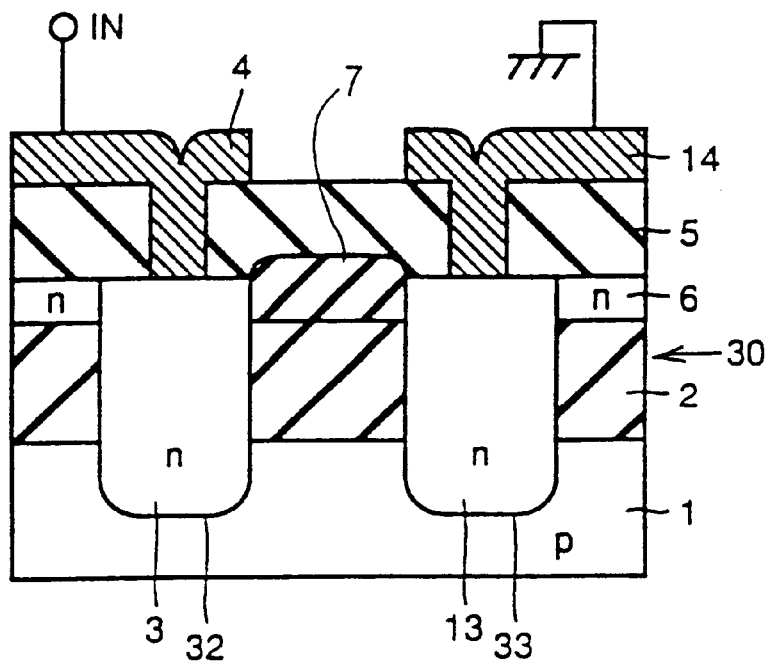
FIG. 2 is a sectional view showing an SOI input protection circuit according to an embodiment 2 of the present invention.
Figure 10:
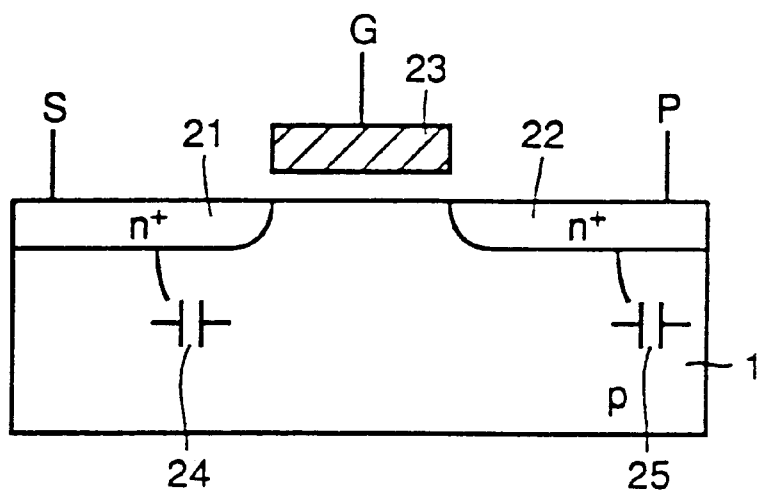
FIG. 10 is a sectional view showing a conventional MOSFET having a bulk structure.
Figure 11:
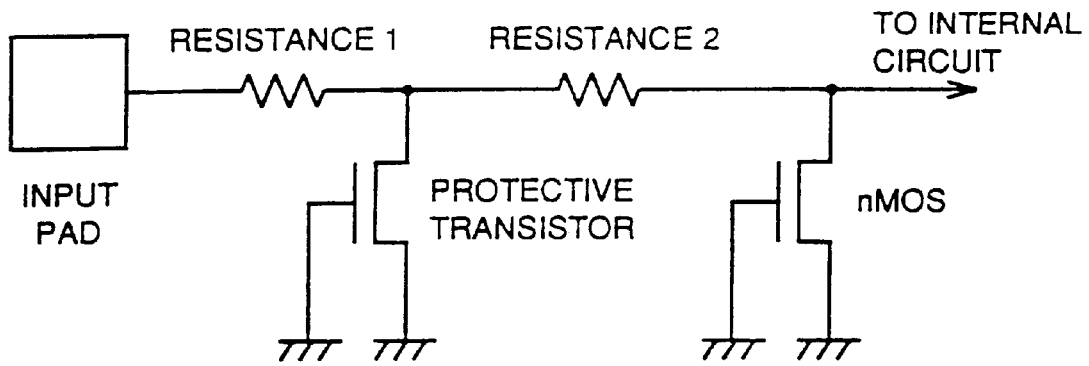
FIG. 11 is a circuit diagram showing a conventional input protection circuit.

FIG. 2 is a sectional view showing an SOI input protection circuit according to an embodiment 2 of the present invention. In a plan view, the shape of the SOI input protection circuit according to the embodiment 2 is identical to that shown in FIG. 10.

Referring to FIG. 2, the SOI input protection circuit comprises an SOI substrate 30. The SOI substrate 30 consists of a P-type silicon substrate 1, a buried oxide film 2 which is formed on the P-type silicon substrate 1, and a silicon layer 6 which is formed on the buried oxide film 2. First and second trenches 32 and 33 are formed in the SOI substrate 30. The first and second trenches 32 and 33 vertically pass through the silicon layer 6 and the buried oxide film 2, to reach the interior of the silicon substrate 1. The first and second trenches 32 and 33 are isolated from each other by a LOCOS oxide film 7. An $n^+$ polysilicon layer 3 is buried in the first trench 32, to be electrically connected with the silicon substrate 1. Another $n^+$ polysilicon layer 13 is buried in the second trench 33, to be electrically connected with the silicon substrate 1. A first metal wire 4 is connected to the n polysilicon layer 3. An end of the first metal wire 4 is connected to an input end, and another end thereof is connected to an internal circuit.

A second metal wire 14 is connected to the n$^+$ polysilicon layer 13. The second metal wire 14 is fixed to the GND. The P-type silicon substrate 1 is fixed at the GND potential.

According to this embodiment, the n$^+$ polysilicon layers 3 and 13 are isolated from each other by the LOCOS oxide film 7, thereby forming a transistor through the P-type silicon substrate 1.

The n$^+$ polysilicon layers 3 and 13 are preferably approached to each other, for facilitating a punch through upon application of a high voltage.

According to this embodiment, an input voltage is limited by a punch through across the source and the drain of the transistor when a high voltage is applied to the input by static electricity or the like. Power concentration can be avoided since the P-N junction area is sufficiently ensured.

Embodiment 3

Figure 3:
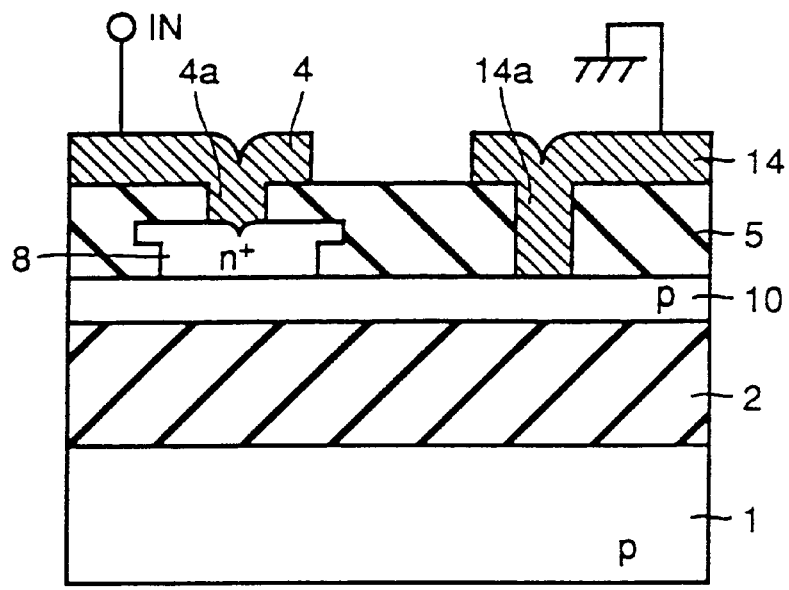
FIG. 3 is a sectional view showing an SOI input protection circuit according to an embodiment 3 of the present invention.

FIG. 3 is a sectional view showing an SOI input protection circuit according to an embodiment 3 of the present invention. In a plan view, the shape of the SOI input protection circuit according to the embodiment 3 is identical to that shown in FIG. 12.

Referring to FIG. 3, the SOI input protection circuit comprises an SOI substrate 30. The SOI substrate 30 consists of a silicon substrate 1, a buried oxide film 2 which is formed on the silicon substrate 1, and a p$^+$ diffusion layer 10 which is formed on the buried oxide film 2 by implanting an impurity into a silicon layer. An n$^+$ polysilicon layer 8 is formed on the p$^+$ diffusion layer 10, to be connected with the p$^+$ diffusion layer 10 by a P-N junction. An interlayer insulating film 5 is formed on the SOI substrate 30, to cover the n$^+$ polysilicon layer 8. A contact hole 4a is formed in the interlayer insulating film 5, to partially expose the surface of the n$^+$ polysilicon layer 8. A first metal wire 4 is provided on the n$^+$ polysilicon layer 8 through the contact hole 4a. An end of the first metal wire 4 is connected to an input pad, and another end thereof is connected to an internal circuit. Another contact hole 14a is also provided in the interlayer insulating film 5 in a position separated from the n$^+$ polysilicon layer 8, for partially exposing the surface of the p$^+$ diffusion layer 10. A second metal wire 14 is connected to the p$^+$ diffusion layer 10 through the contact hole 14. The second metal wire 14 is grounded.

The amount of a P-type impurity which is implanted into the p$^+$ diffusion layer 10 must be larger than that of an N-type impurity into the n$^+$ polysilicon layer 8, so that p$^+$ concentration of the p$^+$ diffusion layer 10 is not reduced when the N-type impurity is implanted for forming the n$^+$ polysilicon layer 8.

When a high voltage is applied, charges are propagated to the n$^+$ polysilicon layer 8 through the metal wire 4. The charges are injected into the p$^+$ diffusion layer 10 by an avalanche breakdown at the P-N junction plane between the n$^+$ polysilicon layer 8 and the p$^+$ diffusion layer 10. The charges which are injected into the p$^+$ diffusion layer 10 escape to the ground through the second metal wire 14.

Embodiment 4

Figure 4:
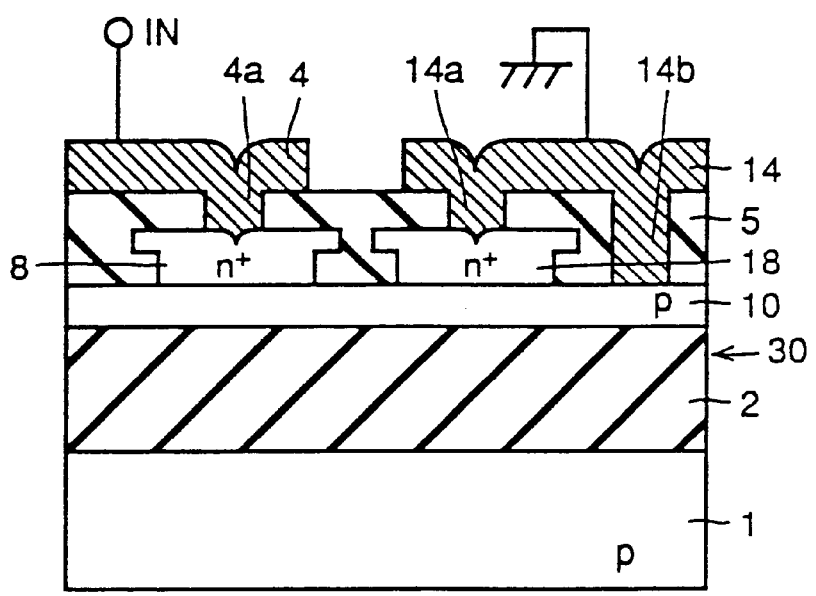
FIG. 4 is a sectional view showing an SOI input protection circuit according to an embodiment 4 of the present invention.

FIG. 4 is a sectional view showing an SOI input protection circuit according to an embodiment 4 of the present invention. In a plan view, the shape of the SOI input protection circuit according to the embodiment 4 is identical to that shown in FIG. 10.

Referring to FIG. 4, the SOI input protection circuit comprises an SOI substrate 30. The SOI substrate 30 consists of a P-type silicon substrate 1, a buried oxide film 2 which is formed on the silicon substrate 1, and a silicon layer 10 (hereinafter referred to as a p$^+$ diffusion layer 10, since a p$^+$ impurity is implanted into this layer) which is formed on the buried oxide film 2. An n$^+$ polysilicon layer 8 is provided on the p$^+$ diffusion layer 10, to be connected with this layer 10. Another n$^+$ polysilicon layer 18 is provided on the p$^+$ diffusion layer 10, to be separated from the n$^+$ polysilicon layer 8 and connected with the p$^+$ diffusion layer 10. An interlayer insulating film 5 is provided on the SOI substrate 30, to cover the n$^+$ polysilicon layers 8 and 18. A contact hole 4a is provided in the interlayer insulating film 5, to partially expose the surface of the n$^+$ polysilicon layer 8. A first metal wire 4 is connected to the n$^+$ polysilicon layer 8 through the contact hole 4a. An end of the first metal wire 4 is connected to an input pad, and another end thereof is connected to an internal circuit.

Another contact hole 14a is also provided in the internal insulating film 5, to partially expose the surface of the n$^+$ polysilicon layer 18. A second metal wire 14 is connected to the n$^+$ polysilicon layer 18 through the contact hole 14a. The second metal wire 14 is grounded. Still another contact hole 14b is provided in the interlayer insulating film 5, to partially expose the surface of the p$^+$ diffusion layer 10. The second metal wire 14 is connected to the p$^+$ diffusion layer 10 through the contact hole 14b.

The n$^+$ polysilicon layers 8 and 18 are preferably approached to each other, for facilitating a punch through. When a high voltage is applied to the input by static electricity or the like, the input voltage is limited by a punch through across the n$^+$ polysilicon layers 8 and 18. Further, charges are injected into the p$^+$ diffusion layer 10 by an avalanche breakdown at the P-N junction plane between the n$^+$ polysilicon layer 8 and the p$^+$ diffusion layer 10. The charges which are injected into the p$^+$ diffusion layer 10 escape to the ground through the second metal wire 14.

Embodiment 5

Figure 5:
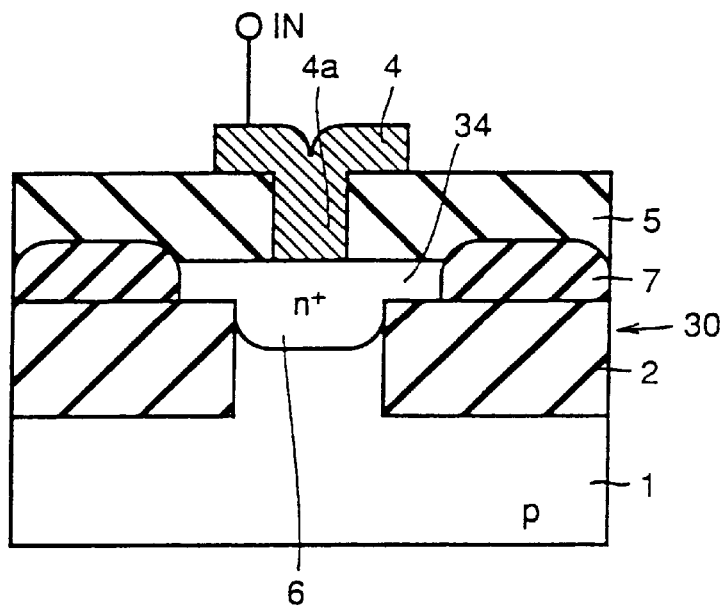
FIG. 5 is a sectional view showing an SOI input protection circuit according to an embodiment 5 of the present invention.

FIG. 5 is a sectional view showing an SOI input protection circuit according to an embodiment 5 of the present invention. In a plan view, the shape of the SOI input protection circuit according to the embodiment 5 is identical to that shown in FIG. 12.

Referring to FIG. 5, the SOI input protection circuit according to the embodiment 5 comprises an SOI substrate 30. The SOI substrate 30 comprises a P-type silicon substrate 1, and a buried oxide film 2, which is formed on the silicon substrate 1, having an opening for partially exposing the surface of the silicon substrate 1. A P-type silicon layer is provided in the opening. A silicon layer 34 is provided on the silicon layer which is provided in the opening of the buried oxide film 2.

Figure 7A:
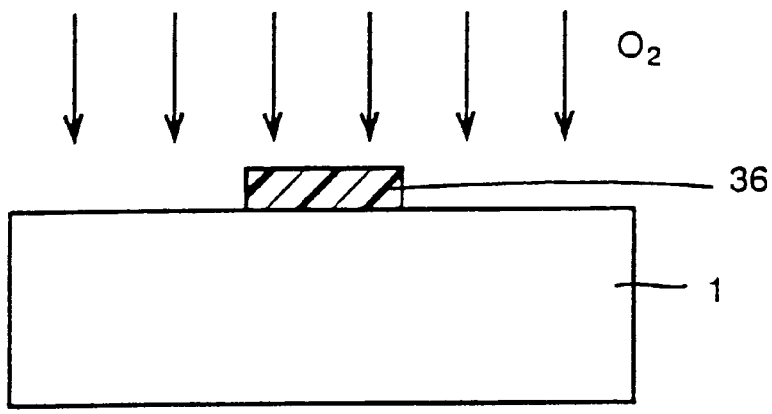
FIGS. 7(a) to 7(c) illustrate a method of manufacturing an SOI substrate which is employed for the SOI input protection circuit according to each of the embodiments 5 and 6.
Figure 7B:
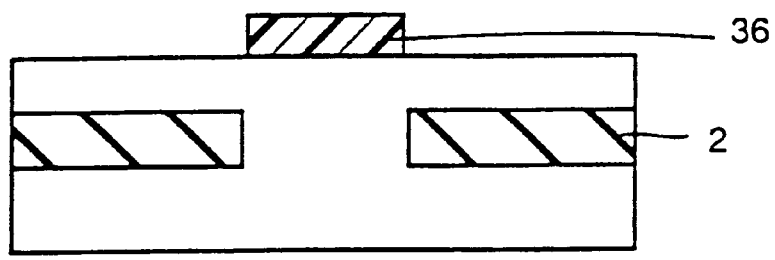
Figure 7C:
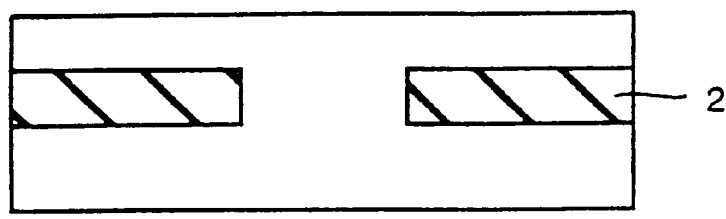

Such an SOI substrate 30 is formed by a method shown in FIGS. 7(a) to 7(c).

Referring to FIGS. 7(a) and 7(b), a mask 36 is formed on a prescribed portion of the silicon substrate 1. Thereafter oxygen is injected into the surface of the silicon substrate 1, to form the buried oxide film 2. Referring to FIGS. 7(b) and 7(c), the mask 36 is so removed that the buried oxide film 2 having an opening is formed in the silicon substrate 1.

Figure 8A:
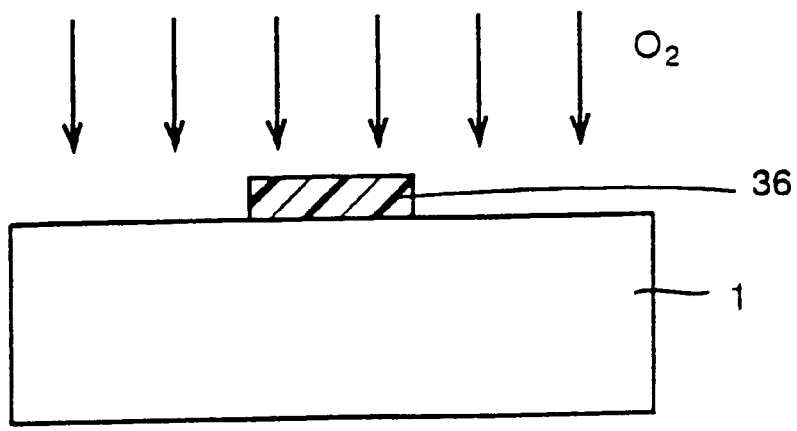
FIGS. 8(a) to 8(c) illustrate another method of manufacturing an SOI substrate which is employed for the SOI input protection circuit according to each of the embodiments 5 and 6.
Figure 8B:
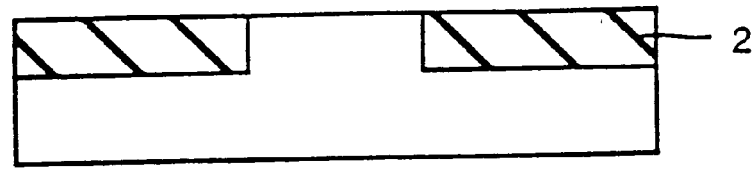
Figure 8C:
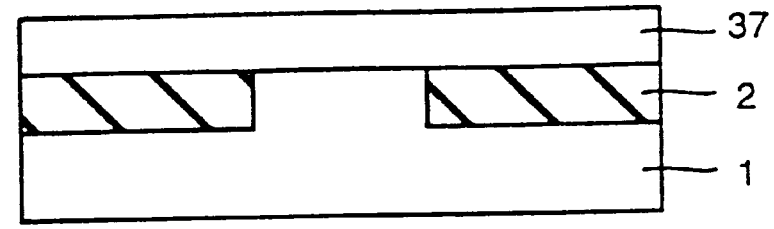
Figure 9:
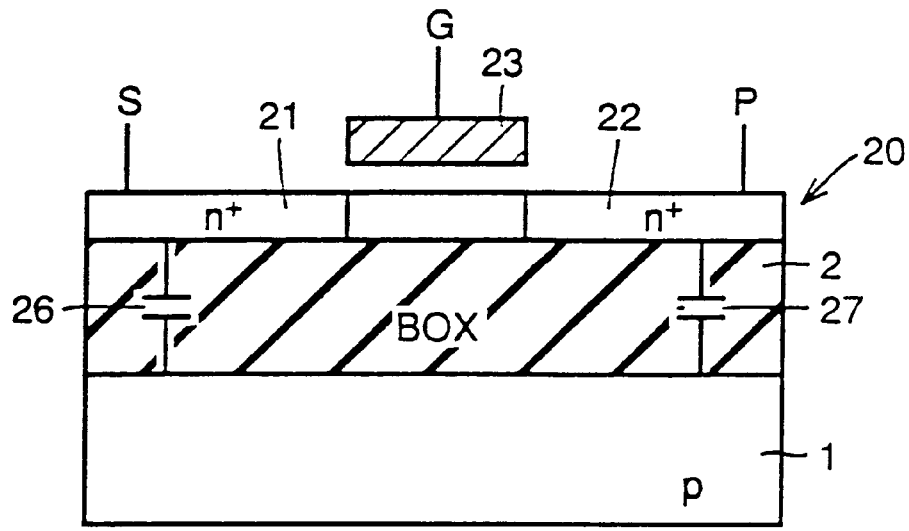
FIG. 9 is a sectional view showing a conventional MOSFET having an SOI structure.

The aforementioned SOI substrate 30 can alternatively be formed by a method shown in FIGS. 8(a) to 8(c). Referring to FIGS. 8(a) and 8(b), a mask 36 is formed on a prescribed portion of the silicon substrate 1. Thereafter oxygen is injected into the surface of the silicon substrate 1, to form the buried oxide film 2.

Referring to FIG. 8(c), a silicon layer 37 is pasted to the surface of the silicon substrate 1. Thus, the buried oxide film 2 having an opening is formed in the silicon substrate 1.

Referring again to FIG. 5, a LOCOS oxide film 7 and an n$^+$ diffusion layer 6 are formed in the surface of the silicon layer 34. An interlayer insulating film 5 is formed on the SOI substrate 30, to cover the n⁺ diffusion layer 6. A contact hole 4a is provided in the interlayer insulating film 5, to partially expose the surface of the n⁺ diffusion layer 6. A metal wire 4 is connected to the n⁺ diffusion layer 6 through the contact hole 4a. An end of the metal wire 4 is connected to an input end, and another end thereof is connected to an internal circuit.

According to this embodiment, a P-N junction area can be sufficiently ensured. When a high-voltage such as static electricity is applied to the input, the input voltage is limited by an avalanche breakdown at the P-N junction of a drain.

Embodiment 6

Figure 6:
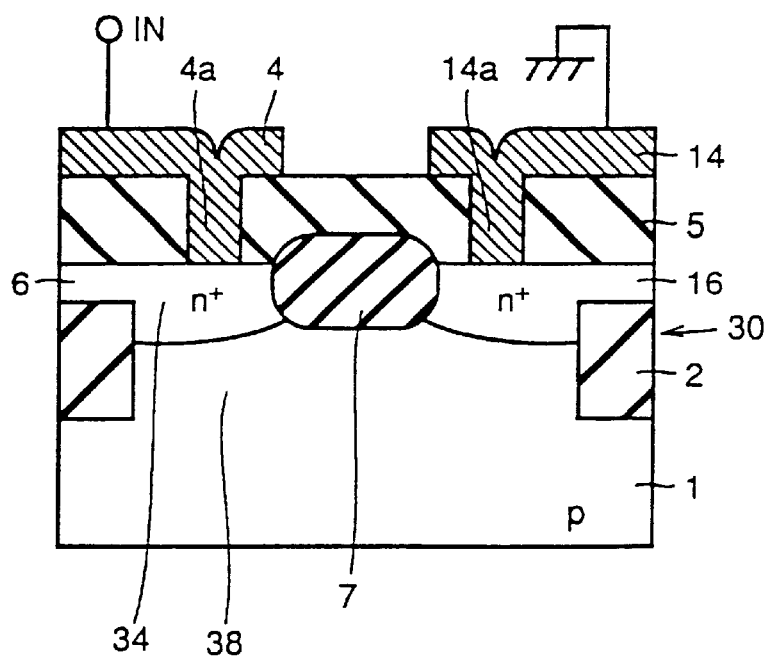
FIG. 6 is a sectional view showing an SOI input protection circuit according to an embodiment 6 of the present invention.

FIG. 6 is a sectional view showing an SOI input protection circuit according to an embodiment 6 of the present invention.

Referring to FIG. 6, the SOI input protection circuit comprises an SOI substrate 30. The SOI substrate 30 consists of a P-type silicon substrate 1, a buried oxide film 2, which is formed on the silicon substrate 1, having an opening for partially exposing the surface of the silicon substrate 1, a silicon layer 38 provided in the opening of the buried oxide film 2, and a silicon layer 34 provided on the buried oxide film 30 and the silicon layer 38. Such an SOI substrate 30 is formed by the method shown in FIGS. 7(a) to 7(c) or FIGS. 8(a) to 8(c). An n⁺ diffusion layer 6 and another n⁺ diffusion layer 16 are formed on the surface of the silicon layer 34, to be separated from each other. The n⁺ diffusion layers 6 and 16 are isolated from each other by a LOCOS oxide film 7. An interlayer insulating film 5 is formed on the SOI substrate 30, to cover the n⁺ diffusion layers 6 and 16. A contact hole 4a is provided in the interlayer insulating film 5, to partially expose the surface of the n⁺ diffusion layer 6. A first metal wire 4 is connected to the n⁺ diffusion layer 6 through the contact hole 4a. An end of the first metal wire 4 is connected to an input pad, and another end thereof is connected to an internal circuit. Another contact hole 14a is provided in the interlayer insulating film 5, to partially expose the surface of the n⁺ diffusion layer 16. A second metal wire 14 is connected to the n⁺ diffusion layer 16 through the contact hole 14a. The n⁺ diffusion layers 6 and 16 form a protective transistor. When a high voltage is applied to the input by static electricity or the like, the input voltage is limited by a punch through across the source and the drain of the protective transistor.

According to this embodiment, a P-N junction of high quality can be formed between the n⁺ diffusion layer 6 and the P-type silicon substrate 1.

According to the present invention, as hereinabove described, a breakdown voltage upon application of a high voltage such as static electricity can be increased by providing a sufficient P-N junction area, also when an SOI structure is employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An SOI input protection circuit being provided between an input pad and an internal circuit, comprising:

an SOI substrate consisting of a first conductivity type silicon substrate, a buried oxide film being formed on said silicon substrate, and a silicon layer being formed on said buried oxide layer;

a first trench vertically passing through said silicon layer and said buried oxide layer to reach the interior of said silicon substrate;

a second trench being provided in separation from said first trench and vertically passing through said silicon layer and said buried oxide layer to reach the interior of said silicon substrate;

a second conductivity type first conductive layer being buried in said first trench to be electrically connected with said silicon substrate;

a second conductivity type second conductive layer being buried in said second trench to be electrically connected with said silicon substrate;

a LOCOS oxide film being provided in said silicon layer to electrically isolate said first and second conductive layers from each other;

a first wire being connected to said first conductive layer and having an end being connected to said input pad and another end being connected to said internal circuit; and a second wire being connected to said second conductive layer, an input voltage being limited by a punch through across said first and second conductive layers.

* * * * *

UNITED STATES PATENT AND TRADEMARK OFFICE
CERTIFICATE OF CORRECTION

PATENT : 6,046,476
DATED : April 04, 2000
INVENTOR(S) : Fukashi MORISHITA, et al.

It is certified that error appears in the above-identified patent and that said Letters Patent is hereby corrected as shown below:

Column 2, Line 14, change "A-A" to --13-13--.

Column 5, Line 63, change "A-A" to --13-13--.

Column 6, Line 1, change "A-A" to --15-15--.

Signed and Sealed this

Twentieth Day of March, 2001

*Attest:*

NICHOLAS P. GODICI

*Attesting Officer*  *Acting Director of the United States Patent and Trademark Office*